United States Patent [19]

Harris

[11] 4,089,709
[45] May 16, 1978

[54] METHOD FOR PASSIVATING ALUMINUM LAYERS ON SEMICONDUCTIVE DEVICES

[75] Inventor: James M. Harris, San Jose, Calif.

[73] Assignee: National Semiconductor Corporation, Santa Clara, Calif.

[21] Appl. No.: 772,714

[22] Filed: Feb. 28, 1977

Related U.S. Application Data

[63] Continuation of Ser. No. 578,617, May 19, 1975, abandoned.

[51] Int. Cl.$^2$ .......................... C23F 7/06; C23F 17/00
[52] U.S. Cl. ..................................... 148/6.27; 148/6.3; 148/31.5; 427/88
[58] Field of Search ...................... 148/6.3, 31.5, 6.27; 427/82, 88

[56] References Cited

U.S. PATENT DOCUMENTS 3,622,843  11/1971  Vermilyea ..................... 148/6.27 X

*Primary Examiner*—James R. Hoffman
*Attorney, Agent, or Firm*—Gail W. Woodward

[57] ABSTRACT

An aluminum layer such as an intraconnect on an integrated circuit semiconductive device is passivated by oxidizing the aluminum layer to form a thin layer of amorphous alumina thereon. The alumina layer is coated with a surface active agent to form a hydrophobic surface on the aluminum oxide to inhibit the creation and growth of ALOOH on the oxide layer. The hydrophobic surface is coated with a conventional passivating material such as silicon dioxide, epoxy or the like.

12 Claims, 2 Drawing Figures

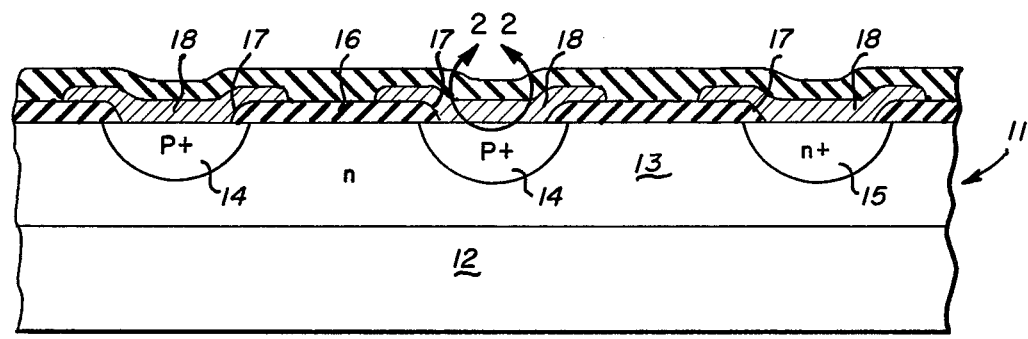
Fig_1
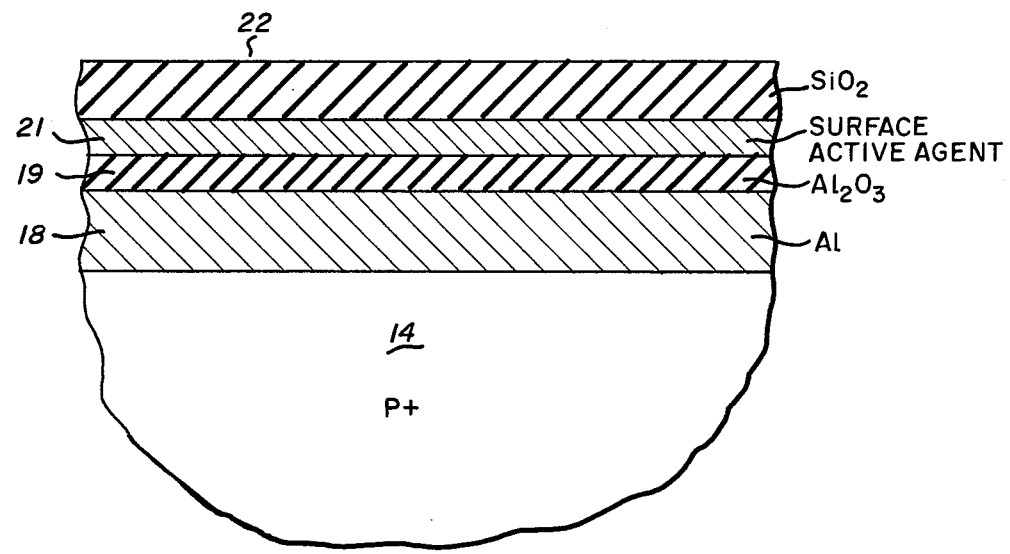
Fig_2

METHOD FOR PASSIVATING ALUMINUM LAYERS ON SEMICONDUCTIVE DEVICES

This is a continuation of application Serial No. 578,617 filed on May 19, 1975 now abandoned.

BACKGROUND OF THE INVENTION

The present invention relates in general to passivating aluminum interconnect layers on semiconductive devices and, more particularly, to an improved method for passivating the aluminum layers such improved method employing a surface active agent cooperating with an oxidized layer of the aluminum to force a hydrophobic surface on the aluminum oxide.

DESCRIPTION OF THE PRIOR ART

Heretofore, aluminum layers such as aluminum intraconnect layers on semiconductive devices have been passivated by anodizing the aluminum to form a relatively thick passivating layer of alumina over the aluminum interconnect. In other cases, the aluminum intraconnect has been passivated by chemically vapor depositing a relatively thick layer of silicon dioxide over the aluminum intraconnect layer. In other cases, the anodized aluminum intraconnect has been overcoated with chemical vapor deposited silicon dioxide for further passivating the aluminum intraconnect layer.

These prior art techniques for passivating the aluminum intraconnect layer have proven less than totally satisfactory, particularly in corrosive environments. It turns out that the anodized alumina protective layer is relatively porous allowing corrosive elements to diffuse through the porous layer to attack the underlying aluminum intraconnect. In the case of chemical vapor deposited silicon dioxide, this material has pin holes and corrosive elements passed through the pin holes and attack the underlying aluminum.

SUMMARY OF THE PRESENT INVENTION

The principal object of the present invention is the provision of an improved method for passivating aluminum layers on semiconductive devices.

In one feature of the present invention, the aluminum layer on the semiconductive device to be passivated is first coated with a very thin layer of alumina by oxidizing the aluminum intraconnect layer. This is followed by coating the oxidized surface of the aluminum with a surface active agent to form a hydrophobic surface on the aluminum oxide to inhibit nucleation and growth of AlOOH on the oxide layer. This hydrophobic surface is then preferably coated with one of the conventional passivating materials in the conventional manner, such chemically vapor deposited silicon dioxide, epoxy resin or the like.

In another feature of the present invention the proton level, i.e., the negative of the work to remove a proton from the surface active agent and place it on a water molecule, of the surface active agent falls within the range of $-0.44$ to $-0.69$ eV.

In another feature of the present invention the radius ratio of the surface active agent, i.e., the radius of the cation in the surface active agent to the radius of the oxygen ion, falls within the range of 0.25 to 0.45.

In another feature of the present invention, the surface active agent forms a compound on the oxide surface of the aluminum layer.

Other features and advantages of the present invention will become apparent upon a perusal of the following specification taken in connection with the accompanying drawings wherein:

BRIEF DESCRIPTION OF THE DRAWINGS

FIG. 1 is a sectional view of a semiconductive device passivated according to the teachings of the present invention, FIG. 2 is an enlarged detail view of a portion of the structure of FIG. 1 delineated by line 2—2.

DESCRIPTION OF THE PREFERRED EMBODIMENTS

Referring now to FIG. 1 there is shown a representative semiconductive device 11, such as an integrated circuit. The integrated circuit device includes a semiconductive substrate member 12, as of silicon, having an epitaxial n type conductivity layer 13 grown thereon. A plurality of p+ type conductivity regions 14 are diffused into the n epitaxial layer 13 for defining a plurality of semiconductive devices formed in the n layer 13. An n+ region 15 is diffused into the n layer 13 for making electrical contact thereto.

A silicon dioxide insulative layer 16 is formed over the surface of the n layer 13, such insulative layer 16 having a plurality of openings 17 therein. An aluminum intraconnect layer 18, having a prescribed pattern in deposited overlaying the insulative layer 16 for making electrical connection to the underlying semiconductive regions 14 and 15 through the openings 17.

Referring now to FIG. 2 there is shown the passivating layers of the present invention employed for passivating the aluminum intraconnect layer 18. First, the intraconnect layer 18 is cleaned by any one or more of the conventional cleaning methods, such as by washing the semiconductive device 11 including the intraconnect layer 18 in deionized water or by treating the aluminum interconnect layer with J-100 photoresist stripper commercially available from Indust-RI Chemical Laboratories of Richardson, Texas.

The aluminum intraconnect layer is typically deposited by vacuum evaporation of aluminum onto the semiconductive device. The intraconnect is then etched through suitable apertures formed in a photoresist layer which has been developed to expose a certain desired pattern for the intraconnect layer on the semiconductive integrated circuit device 11. When the semiconductive device having the aluminum interconnect layer 18 deposited thereon is exposed to air, particularly at elevated temperature, a very thin layer of alumina ($Al_2O_3$) 19 forms on the exposed surface of the aluminum intraconnect layer 18. The alumina layer 19 is very thin, i.e., of a thickness on the order of a few to a few hundred angstroms and is typically of the amorphous variety of alumina.

This alumina layer 19 is then treated in such a manner as to coat its surface with a surface active agent causing a hydrophobic surface layer 21 to form on the surface of the alumina. The hydrophobic surface coating is then preferably overcoated with one of the conventional passivating materials, such as chemically vapor deposited silicon dioxide to form a silicon dioxide passivating layer 22 over the hydrophobic layer 21.

Because the silicon dioxide passivating layer 22 is typically perforated with pin holes, corrosive materials which would otherwise pass through these pin holes into the alumina and then into the aluminum layer for corroding the aluminum, and, in time, rendering the integrated circuit device inoperable, is inhibited or prevented. In other words, the hydrophobic layer 21 serves as a corrosion inhibiting or barrier layer to prevent corrosive materials from corroding the underlying alumina and aluminum layers 19 and 18.

Suitable surface active agents which form the hydrophobic layer 21 to inhibit corrosion are typically ionic with anions being preferred over cations and the strongest inhibiting action being obtained by surface active agents which will form compounds containing the inhibiting substance on the surface of the alumina 19. Compound formation is believed desired because the amorphous state of the alumina 19 implies that an effective inhibitor must cover essentially all of the surface sites. Adsorbed charge particles could cover only a fraction of the surface. Particularly strong corrosion inhibiting substances have proton levels between −0.44 and −0.69 eV where the proton level is the negative of the work to remove a proton from the inhibitor substance and place it on a water molecule. These strong inhibitors also preferably have a ratio of radius of positive ion in the inhibitor to the radius of the oxygen ion, falling within the range of 0.25 to 0.45. Examples of such strong inhibitors include $HWO_4^-$, $H_2SbO_4^-$, $H_2TeO_4^-$, $H_2AsO_4^-$, $H_2PO_3^-$, $HSO_3^-$, $H_2PO_4^-$, $HTeO_3^-$, $H_2VO_4^-$, $H_2AsO_3^-$, $HSeO_3^-$, $H_4IO_6^-$, $H_4SiO_4$, $BeOH^+$.

Moderately strong inhibitors include: $In(OH)_2^+$, $Cu(OH)^+$, $Ni^{+2}$, $SO_4^{-2}$, $SeO_4^{-2}$, $HCrO_4^-$, $MoO_4^{-2}$, $CrOH^{+2}$, $H_4GeO_4$. For a detailed description of inhibiting the aluminum plus water reaction and the various inhibiting agents see; an article by D. A. Vermilyea and W. Vedder titled "Inhibition of the Aluminum + Water Reaction" appearing in the *Transactions of the Faraday Society*, No. 574, Vol. 66, Part 10, of October 1970, pages 2644–2654; an article titled "Surface Active Agents as Corrosion Inhibitors for Aluminum" appearing in the *Journal of the Electrochemical Society*, Vol. 117, No. 6, of June 1970, pages 783–784; and an article titled "Aluminum + Water Reaction" appearing in the *Transactions of the Faraday Society*, No. 554, Vol. 65, Part 2, of February 1969, pages 561–584.

EXAMPLE I

The oxide layer is formed on the aluminum by exposing the aluminum to air at room temperature for a few minutes. The alumina layer 19, thus formed on the aluminum, is amorphous alumina and is cleaned either in deionized water or in J-100 photoresist stripper by rinsing the oxide coated aluminum, as deposited on the semiconductive substrate, in J-100 at 70° C for ten minutes. This rinse is then followed by rinsing the wafer in flowing deionized water for 20 minutes. After cleaning, the wafer is immersed in a passivating aqueous solution of 150 grams of $NH_4NO_3$ to each 200 cc of water at a temperature in the range of 50° to 60° C in the presence of an ultrasonic cleaning agitation obtained from a conventional commercially available ultrasonic cleaner having a power of 500 watts at 40 kilohertz for 5 minutes. This passivating solution serves to form the hydrophobic barrier or surface active agent layer 21. Formation of the inhibiting layer 21 is followed by the rinsing of the wafer in flowing deionized water for 20 minutes. The wafer is then coated with the conventional $SiO_2$ passivating layer 22 by conventional chemical vapor deposition techniques.

EXAMPLE II

This Example is the same as Example I with the exception that the aqueous passivating solution consists of an aqueous solution of 75 grams of $NH_4Cl$ in 200 cc of water.

EXAMPLE III

This Example is the same as Example I with the exception that the passivating solution comprises an aqueous solution of 200 grams of $NH_4H_2PO_4$ in 200 cc of water.

EXAMPLE IV

This Example is the same as Example I with the exception that the passivating solution comprises an aqueous solution of 50 grams of $Al_2(SO_4)_3(NH_4)_2SO_4 \cdot 24H_2O$ in 200 cc of water.

An advantage to the use of the corrosion inhibiting hydrophobic layer 21 on the aluminum layer 19 and in conjunction with an overlaying $SiO_2$ passivating layer 22 is that when such semiconductive devices are exposed to a corrosive atmosphere they provide over 2000 hours operating life with zero failures, whereas the prior art technique which did not utilize the corrosion inhibiting layer 21 exhibited 60% failures at 1200 hours on the same corrosion tests.

What is claimed is:

1. A method for passivating an aluminum layer on a semiconductive device having a substrate containing circuit elements wherein said aluminum layer is deposited on said semiconductive device to form an interconnect pattern for said elements, said method including the steps of:
    oxidizing the surface of said aluminum layer to form an aluminum oxide layer thereon, said aluminum oxide layer being relatively thin with respect to the thickness of said aluminum layer;
    coating said aluminum oxide layer with a surface active agent to form a hydrophobic surface on said aluminum oxide to inhibit nucleation and growth of AlOOH on said aluminum oxide layer; and
    thereafter coating said semiconductor device with a deposited protective layer whereby a device of improved passivity is obtained.
2. The method of claim 1 wherein said surface active agent is an ion.
3. The method of claim 2 wherein said surface active ion is selected from the group consisting of, $PO_4^{-3}$, $SO_4^{-2}$, $NO_3^{-1}$, and $Cl^{-1}$.
4. The method of claim 1 wherein said aluminum oxide layer is coated with said surface active agent by exposing said aluminum oxide surface to be coated to an aqueous solution on $NH_4NO_3$.
5. The method of claim 1 wherein said aluminum oxide layer is coated with said surface active agent by exposing said aluminum oxide surface to be coated to an aqueous solution of $NH_4Cl$.
6. The method of claim 1 wherein said aluminum oxide layer is coated with said surface active agent by exposing said aluminum oxide surface to be coated to an aqueous solution of $NH_4H_2PO_4$.
7. The method of claim 1 wherein said aluminum oxide layer is coated with said surface active agent by exposing said aluminum oxide surface to be coated to an aqueous solution of $Al_2(SO_4)_3(NH_4)_2 SO_4 \cdot 24H_2O$.
8. The method of claim 1 wherein said surface active agent is an anion.

9. The method of claim 1 wherein the surface active agent has a proton level falling within the range of −0.44 to −0.69 eV.

10. The method of claim 1 wherein the surface active agent has a radius ratio of cation to oxygenion falling within the range of 0.25 to 0.45.

11. The method of claim 1 wherein the surface active agent forms a compound on the surface of the alumina.

12. The product made according to the method of claim 1.

* * * * *